United States Patent
Alexander (10) Patent No.: US 9,786,773 B2
(45) Date of Patent: Oct. 10, 2017

(54) THIN-SUBSTRATE DOUBLE-BASE HIGH-VOLTAGE BIPOLAR TRANSISTORS

(71) Applicant: Ideal Power Inc., Austin, TX (US)

(72) Inventor: William C. Alexander, Spicewood, TX (US)

(73) Assignee: Ideal Power, Inc., Austin, TX (US)

( * ) Notice: Subject to any disclaimer, the term of this patent is extended or adjusted under 35 U.S.C. 154(b) by 78 days.

(21) Appl. No.: 14/992,971

(22) Filed: Jan. 11, 2016

(65) Prior Publication Data
US 2016/0268405 A1    Sep. 15, 2016

Related U.S. Application Data

(60) Provisional application No. 62/101,498, filed on Jan. 9, 2015.

(51) Int. Cl.
| | |
|---|---|
| *H01L 29/747* | (2006.01) |
| *H01L 29/74* | (2006.01) |
| *H03K 17/60* | (2006.01) |
| *H03K 17/74* | (2006.01) |
| *H01L 29/72* | (2006.01) |
| *H01L 29/732* | (2006.01) |
| *H03K 17/12* | (2006.01) |
| *H03K 17/567* | (2006.01) |
| *H03K 17/66* | (2006.01) |
| *H01L 29/16* | (2006.01) |

(52) U.S. Cl.
CPC ............ *H01L 29/747* (2013.01); *H01L 29/72* (2013.01); *H01L 29/732* (2013.01); *H01L 29/7416* (2013.01); *H03K 17/12* (2013.01); *H03K 17/567* (2013.01); *H03K 17/60* (2013.01); *H03K 17/665* (2013.01); *H03K 17/74* (2013.01); *H01L 29/1608* (2013.01)

(58) Field of Classification Search
CPC ..... H01L 29/747; H01L 29/732; H01L 29/72; H01L 29/7416; H01L 29/1608; H03K 17/12; H03K 17/567; H03K 17/665; H03K 17/60; H03K 17/74
See application file for complete search history.

(56) References Cited

U.S. PATENT DOCUMENTS

| | | | | |
|---|---|---|---|---|
| 2014/0375287 | A1* | 12/2014 | Blanchard | H01L 29/0817 323/271 |
| 2014/0376291 | A1* | 12/2014 | Blanchard | H01L 29/0817 363/123 |
| 2015/0029769 | A1* | 1/2015 | Blanchard | H01L 29/0817 363/123 |
| 2015/0054552 | A1* | 2/2015 | Blanchard | H01L 29/0817 327/109 |
| 2015/0061732 | A1* | 3/2015 | Blanchard | H01L 29/0817 327/109 |

* cited by examiner

*Primary Examiner* — William F Kraig
*Assistant Examiner* — Pavel Ivanov
(74) *Attorney, Agent, or Firm* — Groover & Associates PLLC; Robert O. Groover, III; Gwendolyn G. Corcoran (57) ABSTRACT

B-TRAN bipolar power transistor devices and methods, using a drift region which is much thinner than previously proposed double-base bipolar transistors of comparable voltage. This is implemented in a high-bandgap semiconductor material (preferably silicon carbide). Very high breakdown voltage, and fast turn-off, are achieved with very small on-resistance.

4 Claims, 13 Drawing Sheets

THIN-SUBSTRATE DOUBLE-BASE HIGH-VOLTAGE BIPOLAR TRANSISTORS

CROSS-REFERENCE

Priority is claimed from 62/101,498, which is hereby incorporated by reference.

BACKGROUND

The present application relates to double-base bipolar transistors.

Note that the points discussed below may reflect the hindsight gained from the disclosed inventions, and are not necessarily admitted to be prior art.

The mainstream of semiconductor process development has historically used silicon (or germanium or their alloys), except where direct-bandgap materials are needed for optoelectronics. However, there has also been a continuing thread of interest in wider-bandgap semiconductors, such as silicon carbide (SiC). SiC exists in several crystal types, but the main focus of semiconductor work has been on 4H SiC.

Silicon carbide has a much wider electronic bandgap (3.3 eV for 4H type) than silicon (1.1 eV), and thus has long been regarded as an attractive material for high-power semiconductor devices. SiC has high thermal conductivity (~3.7 W per degree per cm, as compared to about 1.5 for silicon), high electric field breakdown strength (an order of magnitude higher than silicon's), high maximum current density, and a low coefficient of thermal expansion.

One limitation on the use of SiC has been the defect density, which limited carrier lifetimes. However, the quality of monocrystalline SiC has steadily improved, and is still improving. See e.g. US20140220325, which is hereby incorporated by reference.

Published U.S. application US 2014-0375287 (which is hereby incorporated by reference) disclosed a fully bidirectional bipolar transistor with two base terminals. Such transistors are referred to as "B-TRANs." The base region of the transistor is preferably the bulk of a semiconductor die. The transistor preferably has two emitter/collector regions, one on each face of the die. Two distinct base contact regions are also provided—one on each face of the die. Thus, for example, with a p-type semiconductor die, each face would include an n+ emitter/collector region and a p-type base contact region. Isolation trenches and peripheral field-limiting rings are preferably also included, but in essence the B-TRAN is a four-terminal three-layer device.

Figure 2:
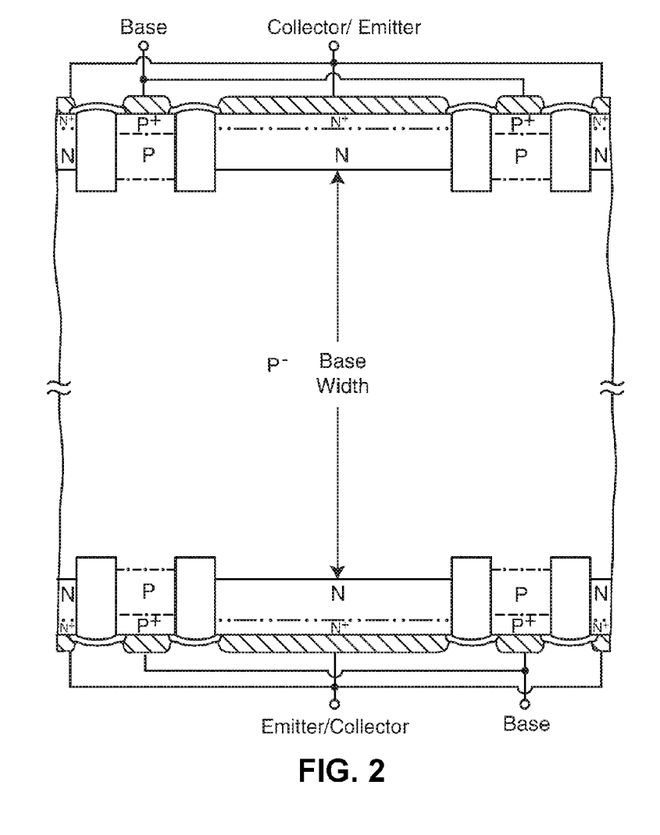
FIG. 2 shows one sample embodiment of a B-TRAN according to the disclosed inventions.

An example of a B-TRAN structure is generally illustrated in FIG. 2. In this Figure, both faces of a semiconductor die carry emitter/-collector regions which form a junction with the bulk substrate. Base contact regions are also present on both faces. This example shows an npn structure, so the emitter/collector regions are n-type, and the base contact regions are p-type. A shallow n+ contact doping provides ohmic contact from the separate emitter/collector terminals (on the two opposite faces of the semiconductor die, in this example) to the emitter/collector regions, and a shallow p+ contact doping provides ohmic contact from the separate base terminals (on the two opposite faces of the die) to the base contact regions. In this example, the dielectric-filled trenches provide lateral separation between the base contact regions and the emitter/collector regions. However, each trench can also include a conducting region, such as doped polysilicon, that is surrounded by a dielectric, and is electrically connected to the emitter/collector to form a vertical field plate, increasing breakdown voltage. (Note that a p-type diffused region may be added to reduce the series resistance between the emitter-to-base junction and the base contact.) B-TRANs can provide significantly better efficiency than is conventionally available for existing static transfer switches; for example, a 1200V B-TRAN has an expected system efficiency of 99.9%.

Application US 2014-0375287 also describes some surprising aspects of operation of this kind of device. Notably: 1) when the device is turned on, it is preferably first operated merely as a diode, and base drive is then applied to reduce the on-state voltage drop. 2) Base drive is preferably applied to the base nearest whichever emitter/collector region will be acting as the collector (as determined by the external voltage seen at the device terminals). This operation is very different from typical bipolar transistor operation, where the base contact is (typically) closely connected to the emitter-base junction but may be far from the collector contact. 3) A two-stage turnoff sequence is preferably used. In the first stage of turnoff, the transistor is brought out of full bipolar conduction, but still is connected to operate as a diode; in the final state of turnoff diode conduction is blocked too. 4) In the off state, base-emitter voltage (on each side) is limited by an external low-voltage diode which parallels that base-emitter junction. This prevents either of the base-emitter junctions from getting anywhere close to forward bias, and avoids the degradation of breakdown voltage which can occur otherwise.

Since the B-TRAN is a fully symmetric device, there is no difference between the two emitter/collector regions. However, in describing the operation of the device, the externally applied voltage will determine which side is (instantaneously) acting as the emitter, and which is acting as the collector. The two base contact terminals are accordingly referred as the "e-base" and "c-base", where the c-base terminal is on the side of the device which happens to be the collector side at a given moment.

Figure 3A:
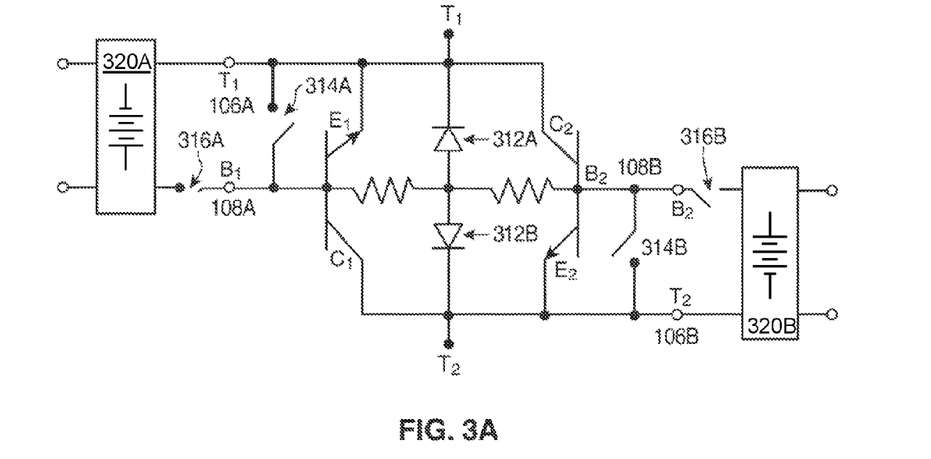
FIGS. 3A, 3B, 3C, 3D, 3E, and 3F show equivalent circuits for an exemplary B-TRAN in various stages of operation.

FIG. 3A shows a sample equivalent circuit for one exemplary NPN B-TRAN. Body diodes 312A and 312B can correspond to e.g. the upper and lower P-N junctions, respectively. Switches 314A and 314B can short respective base terminals 108A and 108B to respective emitter/collector terminals 106A and 106B.

Figure 3B:
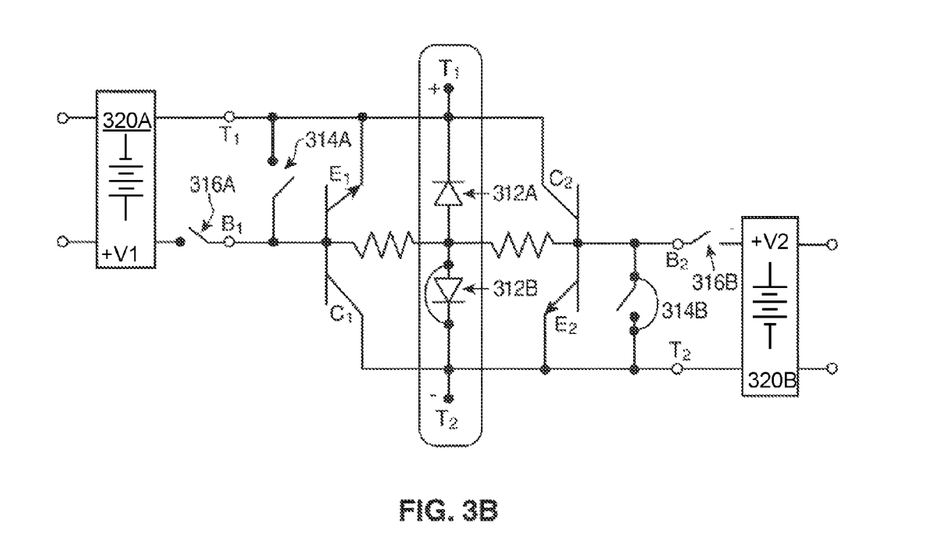

In one sample embodiment, a B-TRAN can have six phases of operation in each direction, as follows:

1) Initially, as seen in FIG. 3B, voltage on emitter/collector terminal T1 is positive with respect to emitter/collector terminal T2. Switches 314A and 316A are open, leaving base terminal B1 open (and unconnected to source of positive charge 320A). Switch 314B is closed, shorting base terminal B2 to emitter/collector terminal T2. This, in turn, functionally bypasses body diode 312B. In this state, the device is turned off. No current will flow in this state, due to the reverse-biased P-N junction (represented by body diode 312A) at the upper side of the device.

Figure 3C:
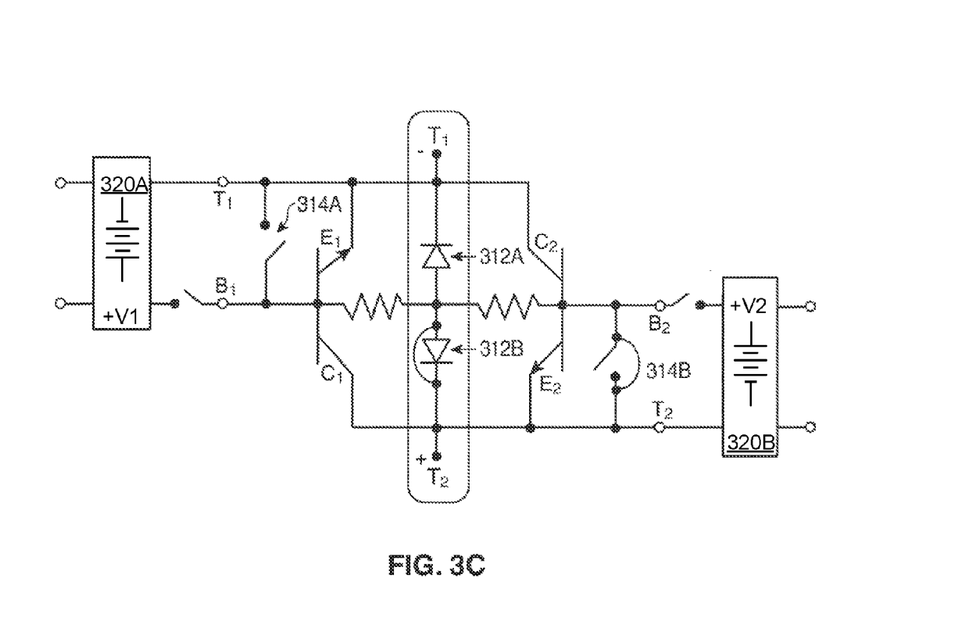

2) As seen in FIG. 3C, the voltage on emitter/collector terminal T1 is brought negative with respect to emitter/collector terminal T2. P-N diode junction 312A is now forward biased, and now begins injecting electrons into the drift region. Current flows as for a forward-biased diode.

After a short time, e.g. a few microseconds, the drift layer is well-charged. The forward voltage drop is low, but greater in magnitude than 0.7 V (a typical silicon diode voltage drop). In one sample embodiment, a typical forward voltage drop (Vf) at a typical current density of e.g. 200 A/cm2 can have a magnitude of e.g. 1.0 V.

Figure 3D:
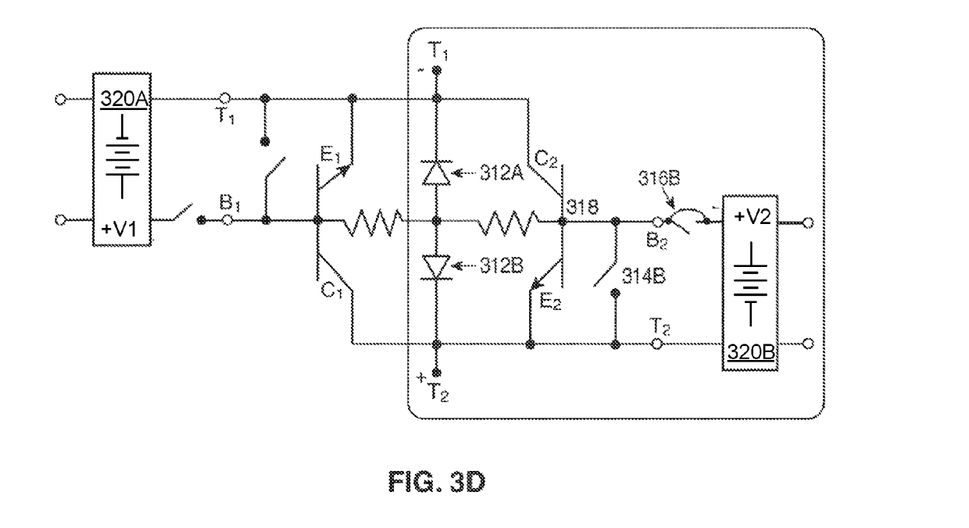

3) To further reduce forward voltage drop Vf, the conductivity of the drift region is increased, as in e.g. FIG. 3D.

To inject more charge carriers (here, holes) into the drift region, thereby increasing its conductivity and decreasing forward voltage drop Vf, base terminal B2 is disconnected from terminal T2 by opening switch 314B. Base terminal B2 is then connected to source of positive charge 320B by switch 316B. In one sample embodiment, the source of positive charge can be, e.g., a capacitor charged to +1.5 VDC. As a result, a surge current will flow into the drift region, thus injecting holes. This will in turn cause upper P-N diode junction 312A to inject even more electrons into the drift region. This significantly increases the conductivity of the drift region and decreases forward voltage drop Vf to e.g. 0.1-0.2 V, placing the device into saturation.

4) Continuing in the sample embodiment of FIG. 3D, current continuously flows into the drift region through base terminal B2 to maintain a low forward voltage drop Vf. The necessary current magnitude is determined by, e.g., the gain of equivalent NPN transistor 318. As the device is being driven in a high level injection regime, this gain is determined by high level recombination factors such as e.g. surface recombination velocity, rather than by low-level-regime factors such as thickness of, and carrier lifetime within, the base/drift region.

Figure 3E:
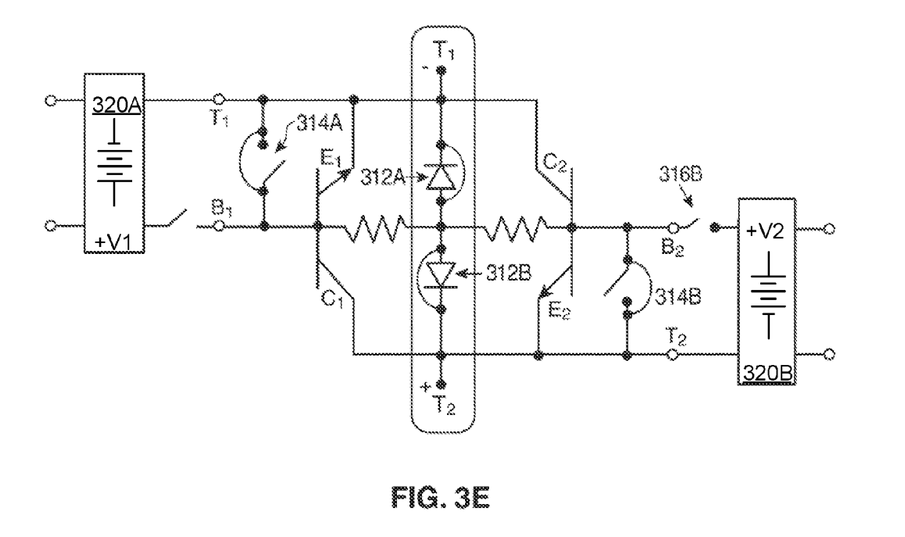

5) To turn the device off, as in e.g. FIG. 3E, base terminal B2 is disconnected from the positive power supply and connected instead to emitter terminal T2, opening switch 316B and closing switch 314B. This causes a large current to flow out of the drift region, which in turn rapidly takes the device out of saturation. Closing switch 314A connects base terminal B1 to collector terminal T1, stopping electron injection at upper P-N junction 312A. Both of these actions rapidly remove charge carriers from the drift region while only slightly increasing forward voltage drop Vf. As both base terminals are shorted to the respective emitter/collector terminals by switches 314A and 314B, body diodes 312A and 312B are both functionally bypassed.

Figure 3F:
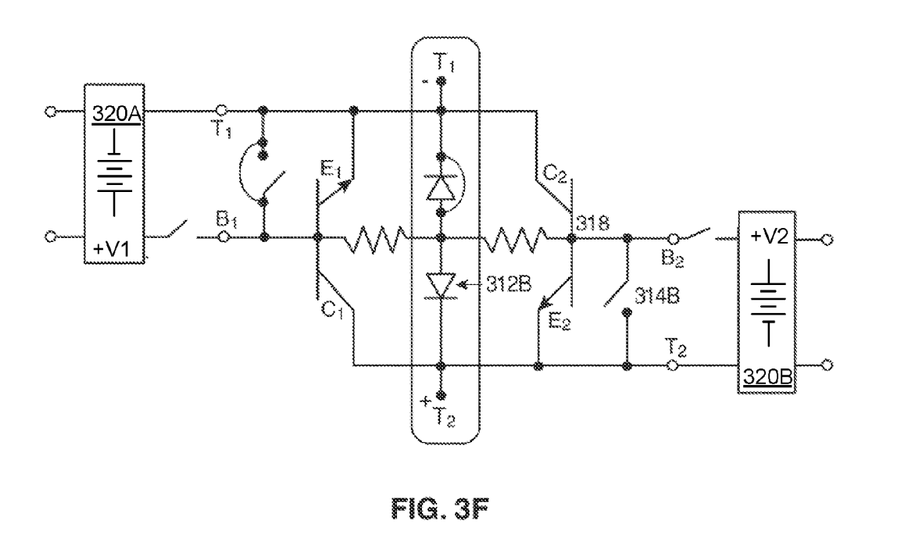

6) Finally, at an optimum time (which can be e.g. nominally 2 μs for a 1200 V device), full turn-off can occur, as seen in e.g. FIG. 3F. Full turn-off can begin by opening switch 314B, disconnecting base terminal B2 from corresponding terminal T2. This causes a depletion region to form from lower P-N diode junction 312B as it goes into reverse bias. Any remaining charge carriers recombine, or are collected at the upper base. The device stops conducting and blocks forward voltage.

The procedure of steps 1-6 can, when modified appropriately, used to operate the device in the opposite direction. Steps 1-6 can also be modified to operate a PNP B-TRAN (e.g. by inverting all relevant polarities).

Note that, even though the B-TRAN is a four-terminal device, with two base contact regions which are operated separately, it operates as a three-layer device—i.e. it only has one base region. That is the center of the die's vertical extent, between the two emitter junctions. Since the B-TRAN is a symmetrically bipolar device, only one of the two emitter/collector regions will be operating as an emitter at any given moment; but the bottom junction of either emitter/collector region is referred to here, for convenience, as an "emitter junction."

Thin-Substrate Double-Base High-Voltage Bipolar Transistors

The present application teaches, among other innovations, new bipolar power transistor devices and methods, using a drift region which is much more conductive and much thinner than previously proposed double-base bipolar transistors. This is implemented in a high-bandgap semiconductor material (preferably silicon carbide). Simulations of high-voltage operation have shown surprisingly good results. Very high breakdown voltage is achieved with very small on-resistance.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present inventor has realized that the low forward voltage drop of B-TRAN structures under collector-side base drive can be adapted to high-bandwidth semiconductors. This configuration has turned out to work particularly well with silicon carbide, as detailed below.

Conventional single-base bipolar transistors have previously been implemented in silicon carbide, and conductivity modulation has produced an acceptably low forward voltage drop. However, it has never been shown before that collector-side base drive will work acceptably in a high-bandgap semiconductor.

Surprisingly, silicon carbide B-TRAN devices can be made to perform very well indeed with collector-side drive. Part of the optimization which has achieved this is to use a high doping concentration and reduced thickness for the bulk of the device (i.e. the part which separates the two junctions).

In one example, the total thickness of the semiconductor die is 52 microns. The depth of the junctions between the emitter/collector regions and the bulk is 2 microns, so the net thickness $t_B$ of the base region is 48 microns. The bulk doping of the starting material, in these examples, is 2.5E15 $cm^{-3}$ p-type. The material used had a minority carrier lifetime, at room temperature, of about 10 microseconds.

With c-base shorted to collector and e-base shorted to emitter, resulting in no collector or emitter current, the measured voltage drop from base contact to base contact, at 100 $A/cm^2$ current density, was 14V. Given the base thickness of 48 microns, that shows a small-signal resistivity of about 29 ohm-cm.

With the above device parameters, a gain (beta) of 8.3 was achieved. Breakdown voltage was 6000 V, and turn-off voltage was 1700 V. On-state forward voltage was 0.6 V. On-state current density was 100 $A/cm^2$. Turn-off energy was less than 1.0 mJ, with a 30 nS rise time to 1700 V after the c-base was opened. These are extremely good results.

Of course, these numbers are just one example. To formulate different examples, a key teaching is that the ratio of bulk doping to thickness is high. In the above example, with junction-to-junction thickness of 48 microns, and bulk doping of 2.5E15 cm$^{-3}$, the ratio of doping to thickness-cubed is about 2.3E22 ($2.3 \times 10^{22}$). (The units of this number are cm$^{-6}$, and are not physically significant.)

For comparison, a 1200V B-TRAN implemented in silicon used a junction-to-junction thickness of 122 microns, and bulk doping of 2.5E15 cm$^{-3}$ p-type. From standard tables, this corresponds to a small-signal bulk resistivity, at room temperature, of about 5.5 ohm-cm. Here the ratio of doping to thickness-cubed is 1.1E21, which is less than a tenth of that for the SiC device.

Surprisingly, a voltage-mode drive is still effective, although the higher bulk resistivity of the doped silicon carbide (as compared to a silicon B-TRAN) adds some current dependence (due to the increased series resistance).

FIG. 2 shows one sample embodiment of a B-TRAN structure in which the disclosed inventions have been implemented. In this implementation the bulk material is 4H silicon carbide, doped at 2.5E15 cm$^{-3}$ p-type.

FIGS. 1A-1E and 4A-4D show simulated voltage and currents for the 6000V sample embodiment discussed above. It will be noted that FIGS. 1A-1E and FIGS. 4A-4D all correspond to the same data set, and show various subsets of the same data over different time intervals. (It will be noted that these plots are all simulation results; the data markers on each line therein are intended to aid in differentiating each data set from each other, and are far from the only data points therein.)

Figure 1A:
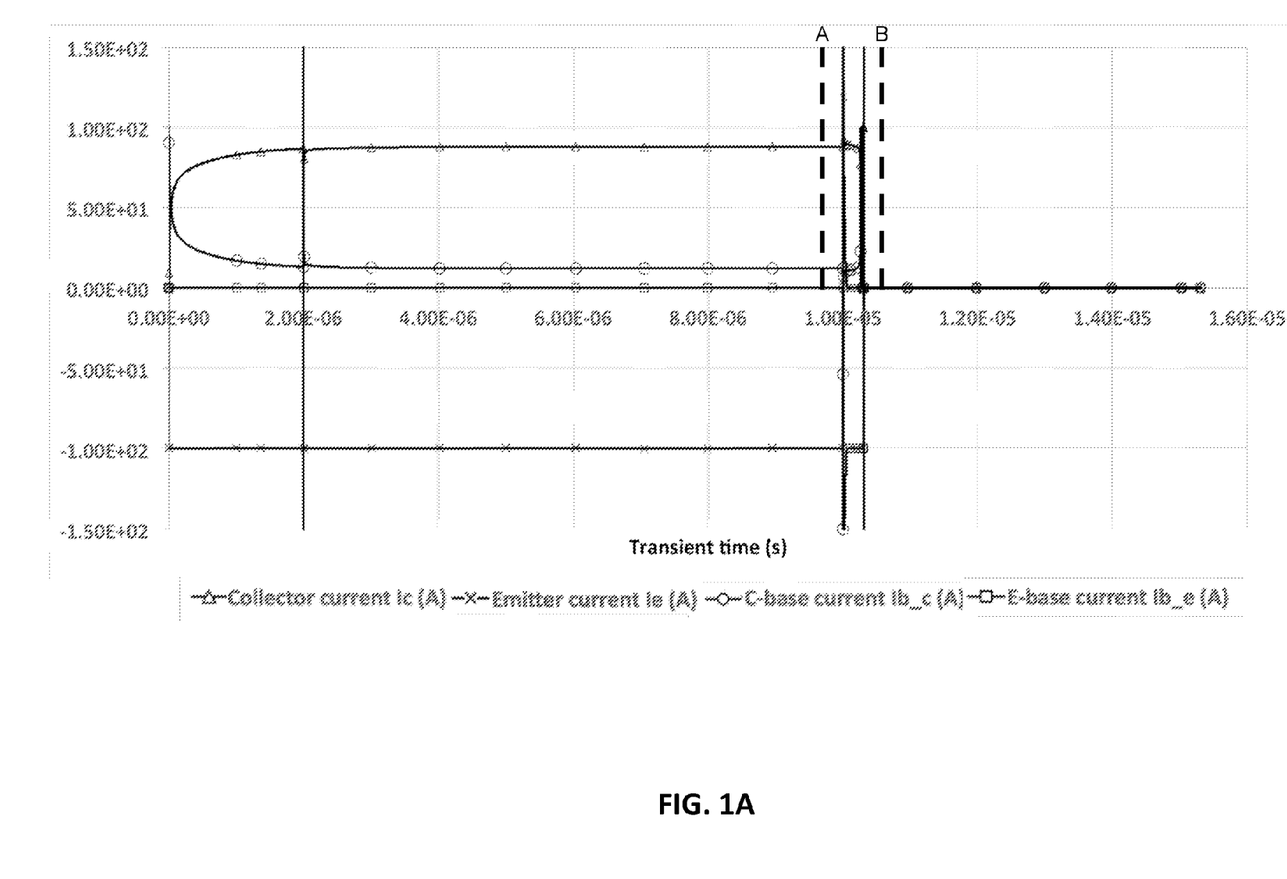
FIGS. 1A, 1B, 1C, 1D, and 1E show simulated voltage and currents for one sample embodiment of the present inventions.

In FIG. 1A, the device begins in the OFF state. Pre-turn-on takes from t=0 s to t=2 µs. At turn-on, emitter current Ie spikes immediately to, and remains steady at, −100 A. Similarly, at turn-on, collector-emitter voltage Vce jumps to 14.3V, and falls off slowly to near 0V. During the pre-turn-on phase, collector current Ic rises from 0 A to about 90 A. C-base current Ib$_C$ mirrors Ic, falling from 100 A to about 10 A such that Ic+Ib$_C$=100 A. During this time, and continuing through t=1.0E-5 s, e-base current Ib$_E$ remains at 0 A.

At time t=2 µs, full turn-on begins. Ic and Ib$_C$ maintain symmetry even at the moment of turn-on: Ic spikes briefly to 268 A, while Ib$_C$ spikes briefly to −168 A, as seen in FIG. 1E. Immediately thereafter, both Ic and Ib$_C$ return to about 90 A and about 10 A, respectively, and remain there until turn-off begins at t=10 µs. Vce, as can better be seen in FIG. 4B, drops immediately from about 3.3V to about 6.2E-1 V, where it remains until turn-off begins at t=10 µs.

Figure 1B:
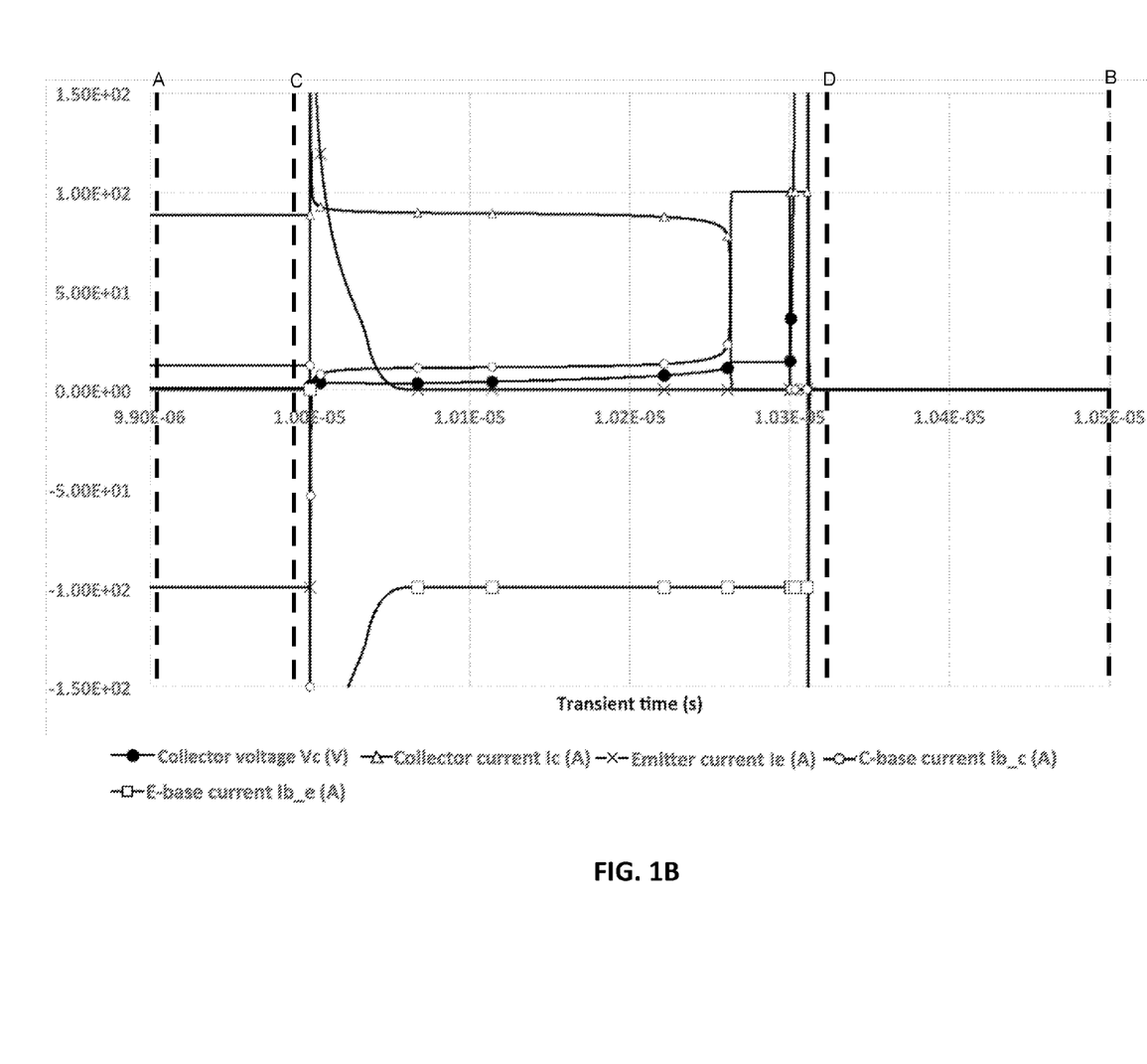

The pre-turn-off phase, which runs from t=10 µs to 13 µs, can better be seen in FIG. 1B. FIG. 1B corresponds to the segment between lines A and B in FIG. 1A, running from t=9.9 µs to t=10.5 µs. At time t=10.0 µs, collector current Ic spikes to 300 A, returns rapidly to its previous level, and falls slowly until about t=10.25 µs, at which point it falls rapidly to 0 A. C-base current Ib$_C$ similarly spikes to −200 A at time t=10.0 µs, returns rapidly to its previous level, rises gradually until about t=10.25 µs, and rises rapidly to 100 A. At t=10 µs, emitter current Ie spikes dramatically from −100 A to 2750 A, as is more evident from FIG. 1E, and drops to 0 A by t=10.1 µs. At the same time, e-base current Ib$_E$ spikes from 0 A to −2850 A, and rises to −100 A by t=10.1 µs.

Figure 1C:
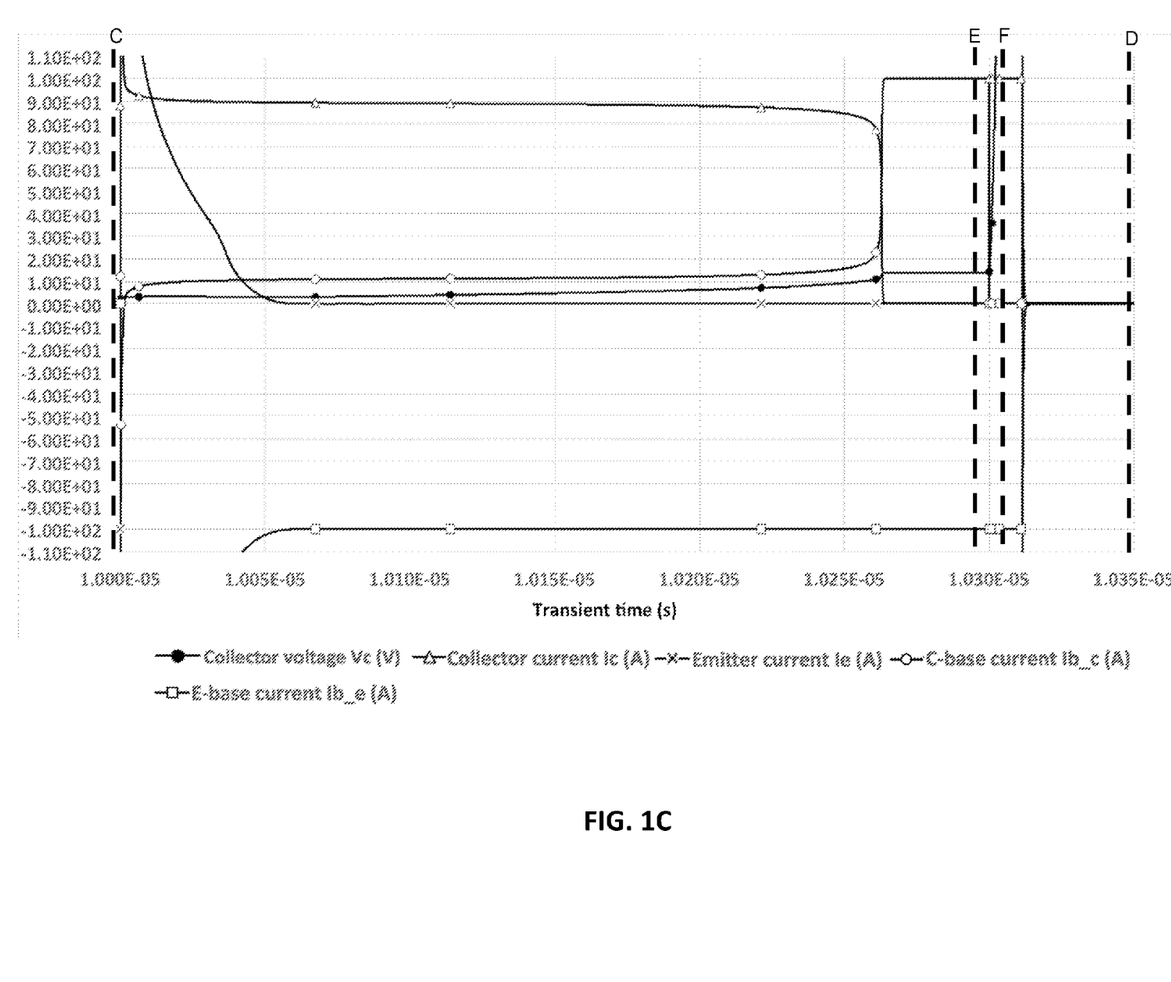

FIG. 1C offers a closer look at the data from FIG. 1B, running from line C at t=10.0 µs to line D at t=10.3 µs.

Figure 4A:
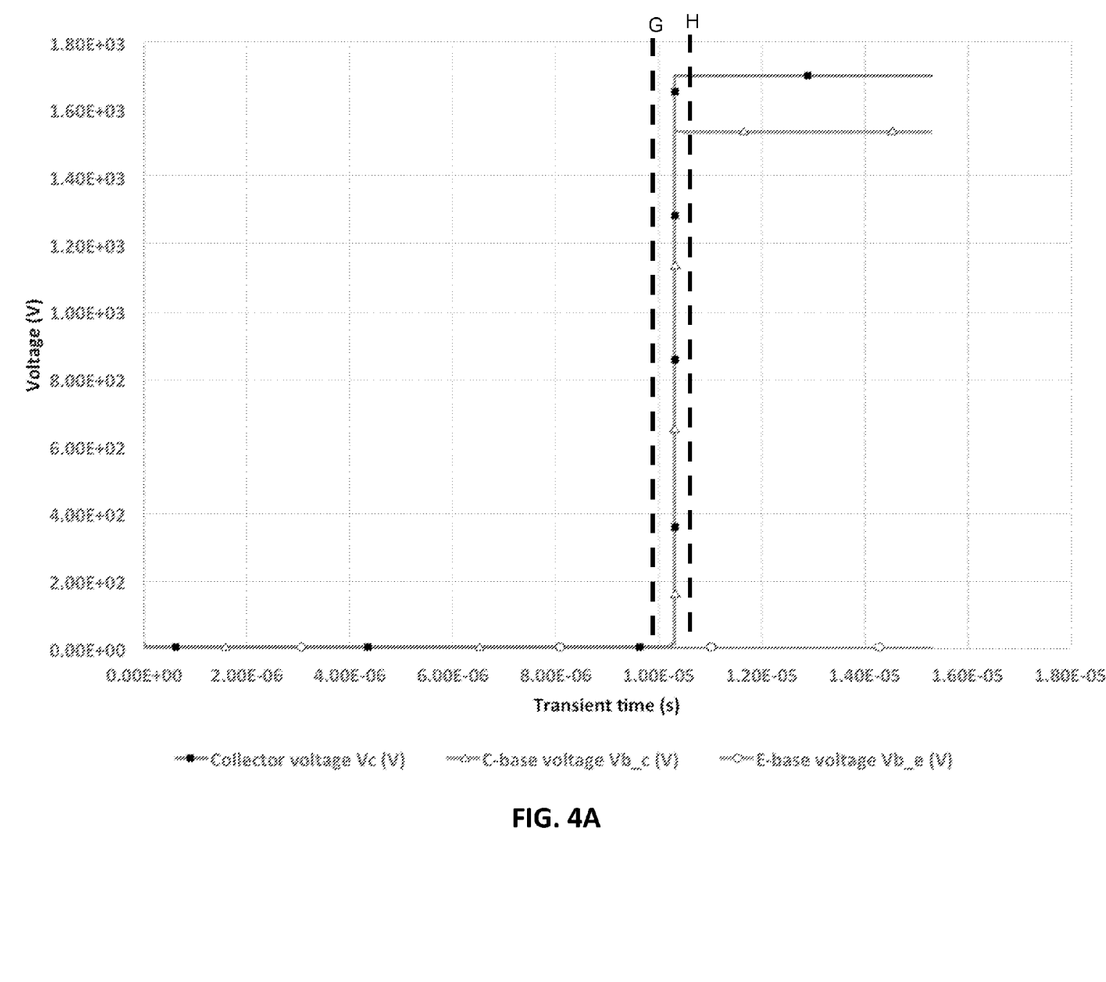
FIGS. 4A, 4B, 4C, and 4D show simulated voltages for the sample embodiment of FIGS. 1A-1E.
Figure 4B:
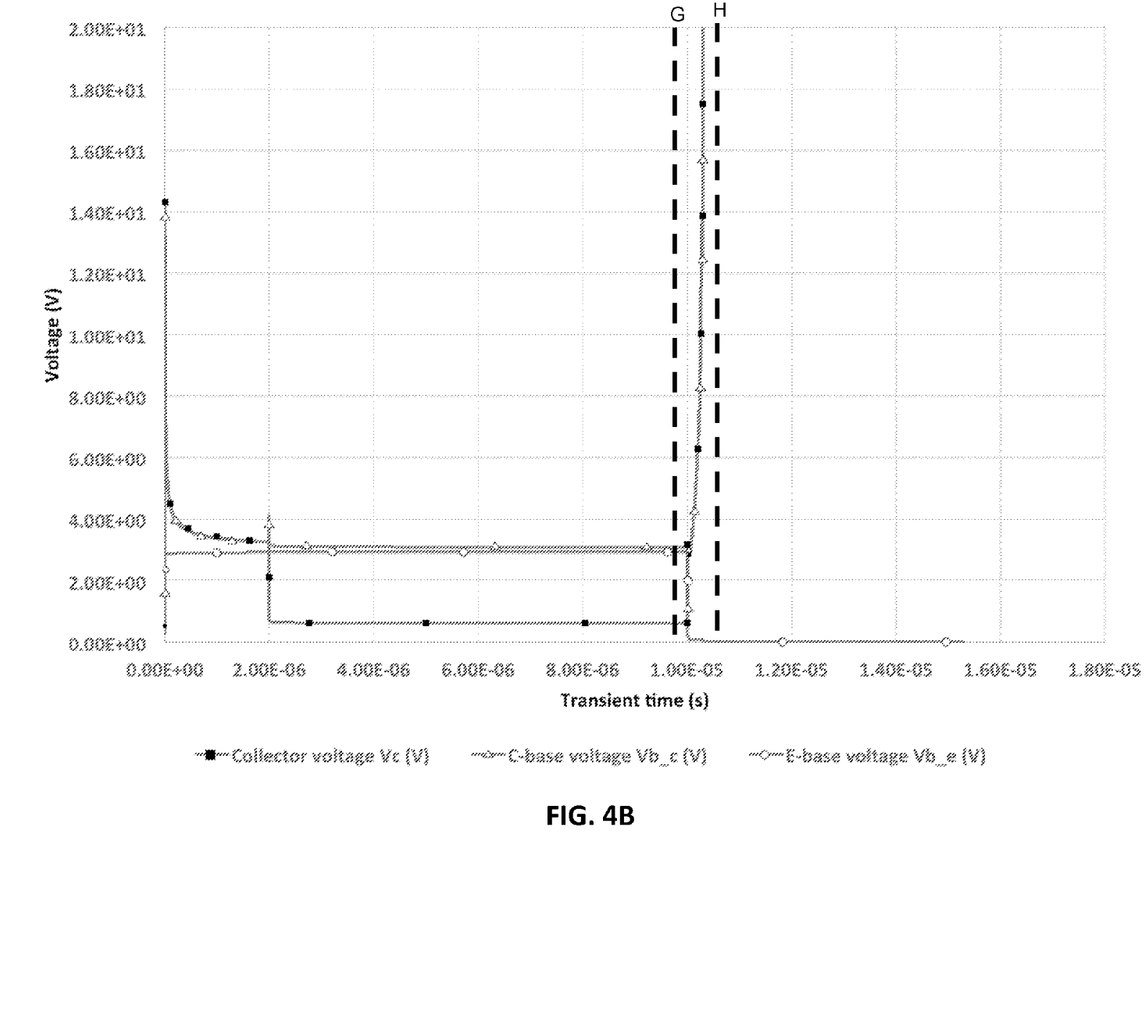
Figure 4C:
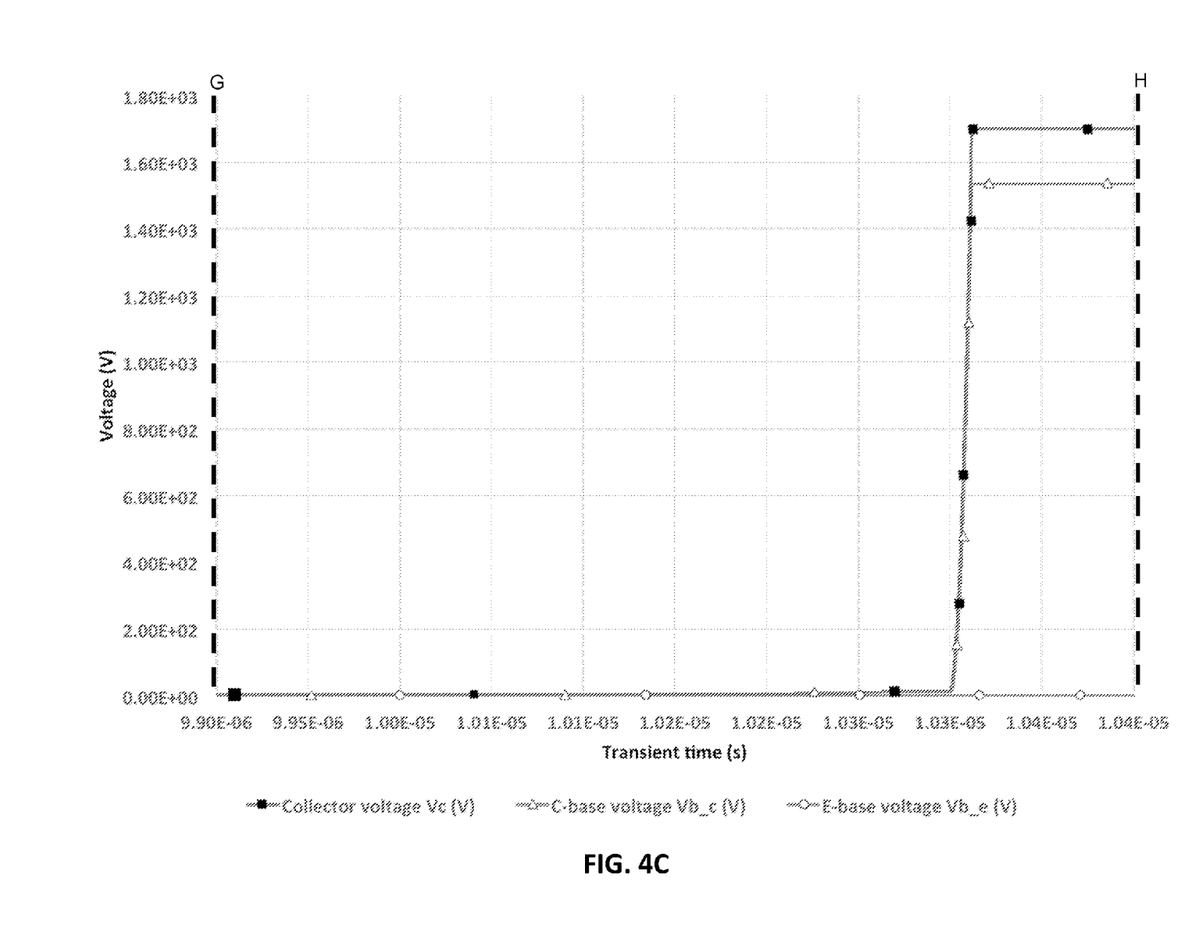
Figure 4D:
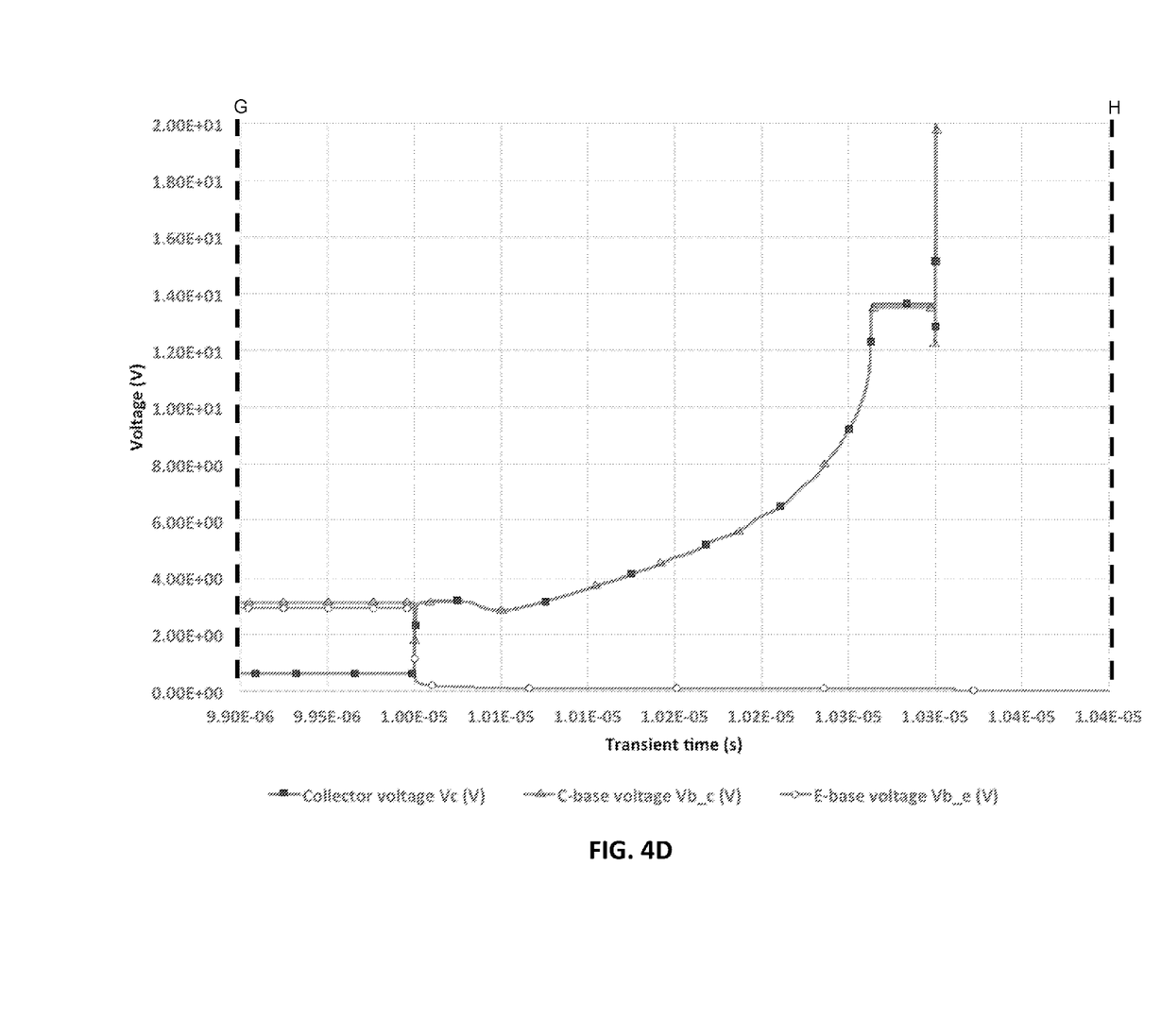

As can be seen in FIG. 4D, collector voltage Vc jumps to about 3V at t=10 µs, and rises until reaching 13.5V at about t=10.26 µs, where it remains until turn-off begins at t=10.3 µs.

Figure 1D:
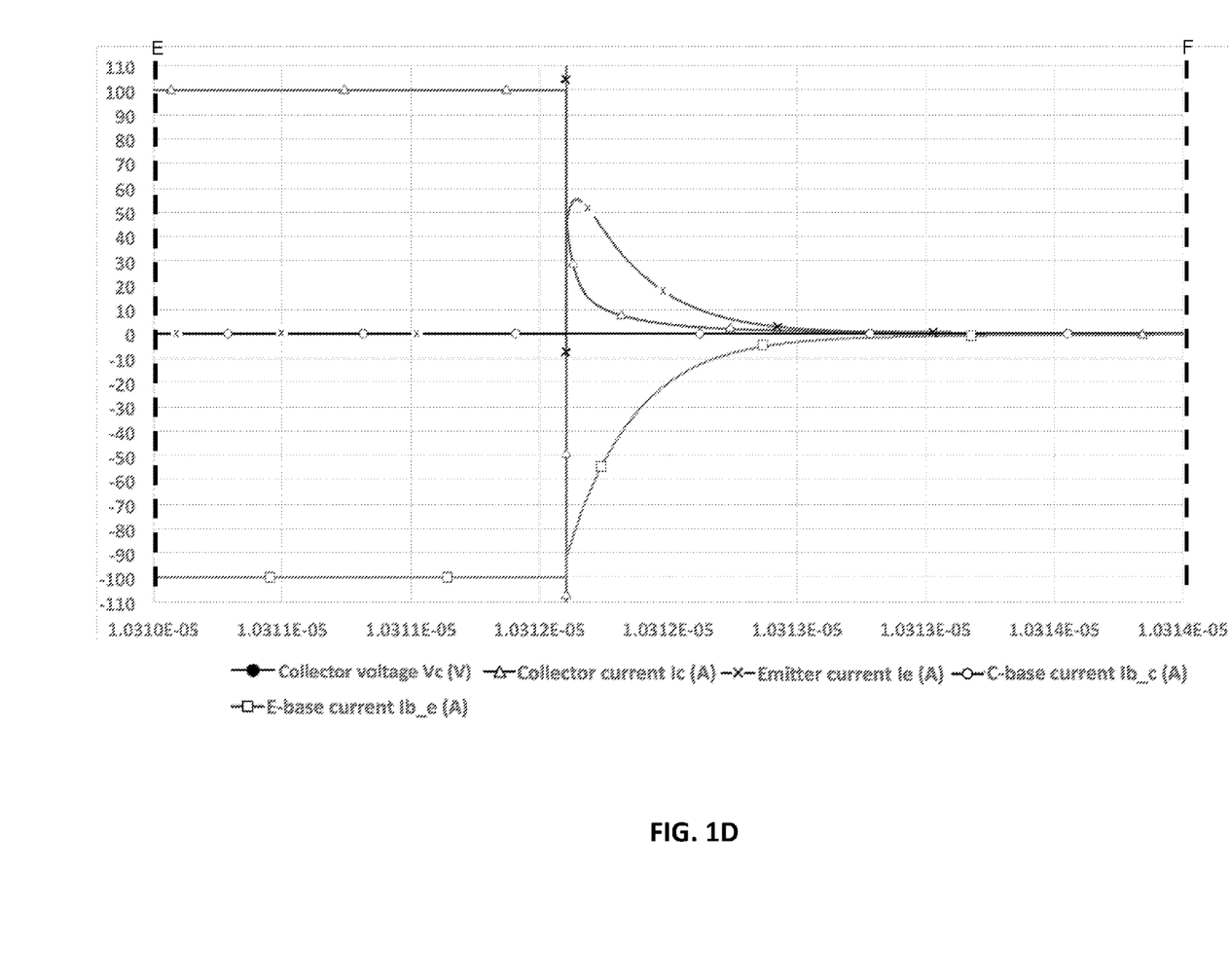
Figure 1E:
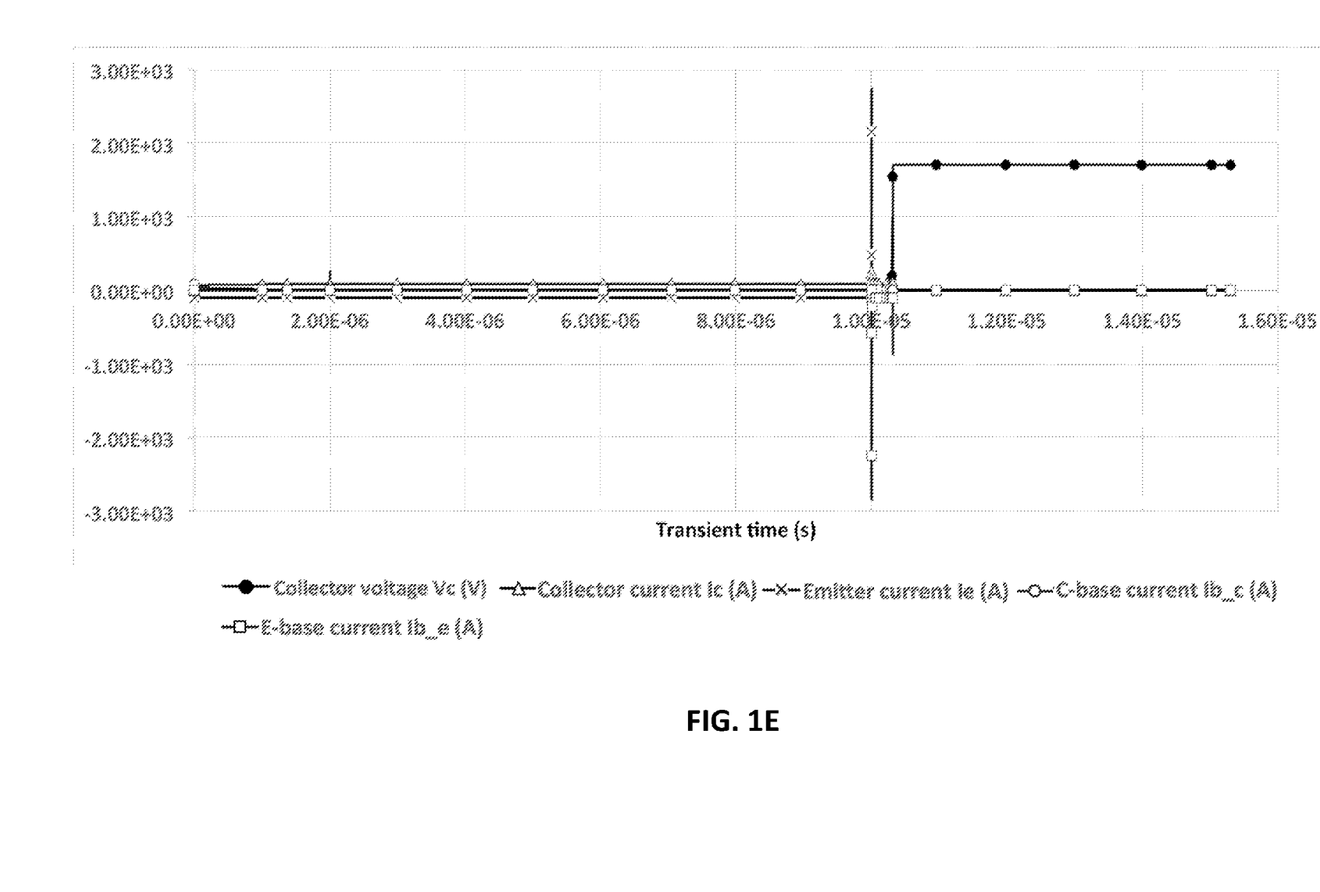

The moment when full turn-off begins can be seen more clearly in FIG. 1D, which shows data from line E of FIG. 1C, at t=10.310 µs, to line F thereof, at t=10.314 µs. At about t=10.312 µs, collector current Ic spikes to −880 A and nearly-instantaneously back to 100 A, then falls gradually back to 0 A. At the same instant, emitter current Ie spikes up to 973 A, near-instantaneously down to −10 A, quickly rises to about 50 A, and then falls off gradually to 0 A. E-base current Ib$_E$ simultaneously rises sharply to −90 A, and then falls gradually off to 0 A. C-base current Ib$_C$ remains at 0 A from the beginning of full turn-off to the end of the simulation.

As can be better seen in FIG. 4A, collector voltage Vc remains very small until about time t=1.0E-5 s. By time t=1.03E-5, Vc has risen to, and then remains at, 1700V.

C-base voltage Vb$_C$ follows collector voltage Vce through pre-turn-on, as seen in FIG. 4B. When turn-on begins at t=2.0 µs, Vb$_C$ spikes to just over 4V, then quickly drops to just over 3V, where it remains until pre-turn-off begins at t=10.0 µs.

When pre-turn-on begins at t=0 µs, e-base voltage Vb$_E$ jumps to about 3V, where it remains until pre-turn-off begins at t=10.0 µs. FIGS. 4C and 4D show a closer view of pre-turn-off and turn-off, running from line G in FIG. 4A, at t=9.9 µs, to line H therein, at t=10.4 µs. As can be seen in FIG. 4D, when pre-turn-off begins at t=10.0 µs, e-base voltage Vb$_E$ begins to fall from its previous stable value of about 3V, asymptotically approaching 0V over the remainder of the simulation. At t=10.0 µs, c-base voltage Vb$_C$ spikes briefly to about 2V, then rises nearly identically to collector voltage Vc, plateauing just slightly below Vc at about t=10.26 µs. When full turn-off begins at t=10.3 µs, Vb$_C$ spikes momentarily down to just over 12V, then rises with Vc. As seen in FIG. 4C, Vb$_C$ reaches a final plateau value, shortly thereafter, of about 1550V, while Vc reaches a higher plateau of about 1750V. Vc, Vb$_C$, and Vb$_E$ remain at these steady-state values until the end of the simulation at t=15.3 µs.

FIGS. 3A, 3B, 3C, 3D, 3E, and 3F show successive stages of operation of a B-TRAN in various stages of operation, as described above. Note, in FIG. 3D, that base drive is applied to the c-base—i.e. to the base contact terminal on the collector side of the device. (In this NPN example, the collector side is whichever side sees the more positive voltage from the external circuit.) Note that the emitter junction is on the opposite side of the die from the active base contact, so base current has to pass through the whole thickness of the die.

The base thickness and doping determine (for a given semiconductor) an area-scaled resistance at the emitter junction. (This area-scaled resistance has units of ohm-cm$^2$, like contact resistance; but there is no contact layer involved here.) The same parameters also affect breakdown voltage, for a given semiconductor. For example, for the SiC device described above, with a bulk resistivity of about 29.2 ohm-cm and a base layer thickness of 48 microns, the area-scaled resistance at the top of the base layer is the product of these parameters, i.e. 0.14 ohm-cm$^2$. For the silicon B-TRAN described above, the area-scaled resistance at the top of the base layer is 0.07 ohm-cm$^2$. However, this does not take account of a crucial difference between the devices: the SiC device has a much higher breakdown voltage. If we divide the rated voltage by the area-scaled resistance, we get 6000/0.14~=43000 V/ohm-cm$^2$ for the SiC B-TRAN device, but we get 1200/0.07~=16500 V/ohm-cm$^2$ for the silicon B-TRAN. This gives a scaling number which reflects the different bandgaps of the different materials, and so is believed to be more useful for extrapolating the teachings of the present application. The units of this scaling number are similar to those for current density, but this scaling number does not necessarily correspond to any actual current density.

Another teaching of the present application is that, in order to implement B-TRANs in a wide-bandgap semiconductor, the base thickness and doping should be chosen so that the rated voltage, divided by the small-signal area-scaled resistance of the base layer, is greater than 25000V/ohm-cm$^2$.

To express this criterion in numbers closer to unity, we can equivalently say that the rated OFF voltage of the device, divided by the resistivity of the semiconductor die in ohm-cm, and further divided by the thickness in microns of the die between the emitter/collector regions on the first and second surfaces, should yield a value greater than two.

ADVANTAGES

The disclosed innovations, in various embodiments, provide one or more of at least the following advantages. However, not all of these advantages result from every one of the innovations disclosed, and this list of advantages does not limit the various claimed inventions.

Improved efficiency in power switching;

Medium voltage switching can be performed without requiring a large stack of devices in series.

According to some but not necessarily all embodiments, there is provided: B-TRAN bipolar power transistor devices and methods, using a drift region which is much thinner than previously proposed double-base bipolar transistors of comparable voltage. This is implemented in a high-bandgap semiconductor material (preferably silicon carbide). Very high breakdown voltage, and fast turn-off, are achieved with very small on-resistance.

According to some but not necessarily all embodiments, there is provided: A power semiconductor device which includes: both an n-type emitter/collector region, and also a p-type base contact region, on both first and second surfaces of a p-type semiconductor die; wherein the material of the semiconductor die has a bandgap greater than two; and wherein the rated OFF voltage of the device, divided by the resistivity of the semiconductor die in ohm-cm, and further divided by the thickness in microns of the die between the emitter/collector regions on the first and second surfaces, yields a value greater than two.

According to some but not necessarily all embodiments, there is provided: A power semiconductor device which includes: both a first-type emitter/collector region, and also a second-type base contact region, on both first and second surfaces of a second-type silicon carbide semiconductor die; and wherein the rated OFF voltage of the device, divided by the resistivity of the semiconductor die in ohm-cm, and further divided by the thickness in microns of the die between the emitter/collector regions on the first and second surfaces, yields a value greater than two.

According to some but not necessarily all embodiments, there is provided: A method for switching a power semiconductor device which includes both a first-type emitter/collector region, and also a second-type base contact region, on both first and second surfaces of a second-type die composed of a semiconductor material having a bandgap energy greater than 2 eV, comprising: in the ON state, flowing base current through the base contact region which is nearer the one of the emitter/collector regions which will act as collector, without flowing base current through the other of the base contact regions; wherein the base contact region on the first surface is not electrically connected to the base contact region on the second surface, except through the semiconductor die itself; and wherein the emitter/collector region on the first surface is not electrically connected to the emitter/collector region on the second surface, except through the semiconductor die itself; whereby bidirectional switching is achieved with low on-state voltage drop and reliable turn-off.

According to some but not necessarily all embodiments, there is provided: A method for switching a power semiconductor device which includes both an n-type emitter/collector region, and also a p-type base contact region, on both first and second surfaces of a p-type SiC die, comprising: in the ON state, flowing base current through the base contact region which is nearer the more positive one of the emitter/collector regions, without flowing base current through the other of the base contact regions; wherein the base contact region on the first surface is not electrically connected to the base contact region on the second surface, except through the semiconductor die itself; and wherein the emitter/collector region on the first surface is not electrically connected to the emitter/collector region on the second surface; whereby bidirectional switching is achieved with low on-state voltage drop and reliable turn-off.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Silicon carbide is the preferred semiconductor material. However, it is also contemplated that the teachings of the present application can be adapted to other wide-bandgap semiconductor materials, as long as those semiconductor materials have relatively long minority carrier lifetimes (at least comparable to that of silicon carbide). Thus, for example, it is contemplated that GaAlN or other III:N semiconductors can be used in the future, if minority carrier lifetimes on the order of a microsecond or better can be achieved.

It is also contemplated that the disclosed inventions can also apply to tertiary or quaternary alloys based on SiC.

It is also contemplated that the disclosed inventions can also apply to semiconductor materials whose band structure is altered by strain, or by a superlattice structure, or by other heteroepitaxial structures.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A power semiconductor device which includes:
    both an n-type emitter/collector region, and also a p-type base contact region, on each of both first and second surfaces of a p-type semiconductor die; wherein each said emitter/collector region is positioned to act as an emitter of a bidirectional switch while the other emitter/collector region acts as a collector thereof;
    wherein the material of the semiconductor die has a bandgap greater than two eV;
    and wherein the rated OFF voltage of the device, divided by the resistivity of the semiconductor die in ohm-cm, and further divided by the thickness in microns of the die between the emitter/collector regions on the first and second surfaces, yields a value greater than two amps per cm-µm;
    wherein the base contact region on the first surface is not electrically connected to the base contact region on the second surface, except through the semiconductor die itself; and
    wherein the emitter/collector region on the first surface is not electrically connected to the emitter/collector region on the second surface, except through the semiconductor die itself.

2. The device of claim 1, wherein the semiconductor die is silicon carbide.

3. A power semiconductor device which includes:
    both a first-conductivity-type emitter/collector region, and also a second-conductivity-type base contact region, on each of both first and second surfaces of a second-conductivity-type silicon carbide semiconductor die;
    and wherein the rated OFF voltage of the device, divided by the resistivity of the semiconductor die in ohm-cm, and further divided by the thickness in microns of the die between the emitter/collector regions on the first and second surfaces, yields a value greater than two amps per cm-µm;
    wherein the base contact region on the first surface is not electrically connected to the base contact region on the second surface, except through the semiconductor die itself; and
    wherein the emitter/collector region on the first surface is not electrically connected to the emitter/collector region on the second surface, except through the semiconductor die itself.

4. The device of claim 3, wherein the semiconductor die is p-type.

* * * * *